(12) United States Patent
Eshel

(10) Patent No.: US 7,885,082 B2
(45) Date of Patent: Feb. 8, 2011

(54) COMMUNICATION CABINET AND A METHOD FOR INSTALLING ACTIVE COMPONENTS IN A COMMUNICATION CABINET

(75) Inventor: Hanoch Eshel, Nes Ziona (IL)

(73) Assignee: Teledata Networks Limited, Herzliya (IL)

( * ) Notice: Subject to any disclaimer, the term of this patent is extended or adjusted under 35 U.S.C. 154(b) by 996 days.

(21) Appl. No.: 11/530,791

(22) Filed: Sep. 11, 2006

(65) Prior Publication Data

US 2007/0285910 A1 Dec. 13, 2007

Related U.S. Application Data

(60) Provisional application No. 60/804,094, filed on Jun. 7, 2006.

(51) Int. Cl.
*H01R 12/16* (2006.01)
(52) U.S. Cl. ...................... 361/788; 361/753
(58) Field of Classification Search ............. 361/752, 361/800, 790, 797, 753
See application file for complete search history.

(56) References Cited

U.S. PATENT DOCUMENTS

| | | | | |
|---|---|---|---|---|
| 5,664,950 A | * | 9/1997 | Lawrence | 439/76.1 |
| 5,761,033 A | * | 6/1998 | Wilhelm | 361/679.33 |
| 6,144,561 A | * | 11/2000 | Cannella et al. | 361/796 |
| 6,205,206 B1 | * | 3/2001 | Hersh et al. | 379/88.26 |
| 6,542,382 B2 | * | 4/2003 | BuAbbud et al. | 361/816 |
| 7,379,304 B2 | * | 5/2008 | Udd | 361/719 |
| 7,457,134 B2 | * | 11/2008 | Ice | 361/816 |
| 2004/0120508 A1 | * | 6/2004 | Sajadi et al. | 379/399.01 |

* cited by examiner

*Primary Examiner*—Hung S Bui
(74) *Attorney, Agent, or Firm*—Matthew A. Pequignot; Pequignot + Myers LLC

(57) ABSTRACT

A communication cabinet and methods for installing active component into a communication cabinet, the method includes: removing at least one passive communication connector being connected by at least one wire to at least one customer connector within the communication cabinet; installing at least one printed circuit board that are connected to at least one active communication component and to at least one slim edge connector; wherein the printed circuit boards are shaped such as to be completely positioned within the communication cabinet; and connecting the at least one wire to the at least one slim edge connector.

11 Claims, 13 Drawing Sheets

300 installing at least one printed circuit board that is connected to at least one active communication component and to at least one slim edge connector. The printed circuit boards are shaped such as to be completely positioned within the communication cabinet. The depth of the communication cabinet does not exceed 30 centimeter.
410 connecting at least one wire between the at least one slim edge connector and between one customer connector within the communication cabinet. 420

COMMUNICATION CABINET AND A METHOD FOR INSTALLING ACTIVE COMPONENTS IN A COMMUNICATION CABINET

RELATED APPLICATIONS

This application claims the priority benefit of U.S. Provisional Application No. 60/804,094 Filed Jun. 7, 2006, which is incorporated herein by reference.

FIELD OF THE INVENTION

The present invention relates to methods for installing active components in communication cabinets and to communication cabinets.

BACKGROUND OF THE INVENTION

Modern networks may include a large amount of communication cabinets.

FIG. 1 illustrates a prior art communication cabinet 2. Communication cabinet 2 includes a first set of passive connectors 5 and a second set of passive connectors 7. Multiple wires (collectively denoted 6) connect between connectors of first set to connectors 5 and connectors of second set of connectors 7. Connectors of the second set are also referred to as customer connectors. Multiple connectors of first set of connectors 7 are also connected to an input cable 3 via wires 4.

Input cable 3 is conveniently connected to a central office (not shown). Multiple connectors of second set of connectors 6 are also connected to output cables such as output cables 9, 9' and 9". Each output cable (out of output cables 9, 9' and 9") includes multiple wires that connect multiple customer connectors to multiple customer premises equipment. Conveniently, first set of connectors 5 includes a large number of horizontally installed connectors that are arranged in two columns. Conveniently, second set of connectors 7 includes a large number of horizontally installed connectors that are arranged in three columns, one column per output cable.

Modern telephone networks were primary designed to convey voice. Due to the rapid development of computerized systems these systems were modified such as to convey high rate data. Data is transferred by utilizing a group of technologies known collectively as "Digital Subscriber Line" (DSL) services or (xDSL) services, e.g., Asymmetrical Digital Subscriber Line (ADSL), High-Bit Rate Digital Subscriber Line (HDSL), Rate Adaptive Digital Subscriber Line (RADSL), Symmetric Digital Subscriber Line (SDSL), etc. These services provide high-speed connections over existing copper wires (also known as twisted pair) used to carry conventional telephone traffic. These services use various modulation schemes and other techniques to allow the data to be transmitted over the existing copper lines at higher speeds. In addition to data, some of these DSL technologies provide both data and voice services. This voice service is called voice over (VODSL) service.

Due to various characteristics of DSL technologies the distance between the customer premises and service provider equipment is quite limited. In order to increase the distance active components such as amplifiers and the like are installed in communication cabinets that are relatively close to the customer's premises.

A typical DSL network includes customer premises equipment such as a telephone and a computer that is connected to a DSL modem. The DSL modem transmits data within a frequency range that differs from the low frequency range of voice. Both voice and data are combined by a customer premises combiner. These signals are conveyed over a pair of copper wires and reach a Main Distribution Frame (MDF). In the MDF the voice signals are separated from the data conveying signals by a splitter. The voice then propagates over the Plain Old Telephone Service (POTS) to a centralized location while the data conveying signals are amplified and are sent via a Digital Subscriber Line Access Multiplexer (DSLAM) to a data network such as but not limited to an ATM network, a Frame Relay network the internet and the like. The DSLAM links many customer DLS connection to a single ATM line.

Various examples of prior art MDF equipment can be found at the following U.S. patents and patent applications, all being incorporated herein by reference: U.S. Pat. No. 6,782,097 of Witty et al. titled "Splitter device for MDU/MTU environments" describes an exemplary prior art splitter device for a MTU environment; U.S. Pat. No. 6,831,930 of Swam titled "Access panel for network end line sharing ADSL/POTS splitter application" describes a system and access panel that provides direct access to carrier signals; U.S. Pat. No. 6,826,280 of Sajadi et al., titled "Systems and methods for managing digital subscriber line (DSL) telecommunications connections" describes various wiring solutions for an MDF.

The DSLAM is regarded as an active element as it includes amplifiers and additional components that alter the incoming signal while cross connectors that connect subscribers lines to central office lines are defined as passive elements.

The replacement of a previously installed communication cabinet by a more advances communication cabinets, end especially the introduction of active communication components can require substantial amount of time to install and may be highly intrusive to a customer's operation or business.

There is a need to provide an efficient method for installing active components in a communication cabinet and an advanced communication cabinet.

SUMMARY OF THE PRESENT INVENTION

A method for installing active component into a communication cabinet, the method includes: installing at least one printed circuit board that is connected to at least one active communication component and to at least one slim edge connector; wherein the printed circuit boards are shaped such as to be completely positioned within the communication cabinet; wherein a depth of the communication cabinet does not exceed 30 centimeter; and connecting at least one wire between the at least one slim edge connector and between one customer connector within the communication cabinet.

A communication cabinet that includes: customer connectors adapted to be connected via multiple wires to end user equipment, and multiple printed circuit boards that are connected to each other by backplane, wherein each printed circuit board connected to at least one active communication component and to a slim edge connector; wherein the multiple printed circuit boards are shaped such as to be completely positioned within the communication cabinet; wherein a depth of the communication cabinet does not exceed 30 centimeters; and wherein multiple slim edge connectors are connected to the customer equipment via at least one wire.

A method for installing active component into a communication cabinet, the method includes: removing at least one passive communication connector being connected by at least one wire to at least one customer connector within the communication cabinet; installing at least one printed circuit board that are connected to at least one active communication component and to at least one slim edge connector; wherein the printed circuit boards are shaped such as to be completely positioned within the communication cabinet; and connecting the at least one wire to the at least one slim edge connector.

BRIEF DESCRIPTION OF THE DRAWINGS

The present invention will be understood and appreciated more fully from the following detailed description taken in conjunction with the drawings in which:

FIG. 13 is a flow chart of a method for installing a modular communication cabinet, according to another embodiment of the invention.

DETAILED DESCRIPTION OF PREFERRED EMBODIMENTS

Methods for installing active communication components is provided. Conveniently, the method allows to install printed circuit boards connected to active communication components and slim edge connectors within communication cabinets and especially narrow communication cabinets that are characterized by a depth that is 30 centimeters or less.

According to an embodiment of the invention the installation includes removing passive communication connectors. According to another embodiments of the invention the installation of the printed circuit boards, active communication components and slim edge connectors does not require to remove passive communication connectors.

Figure 2:
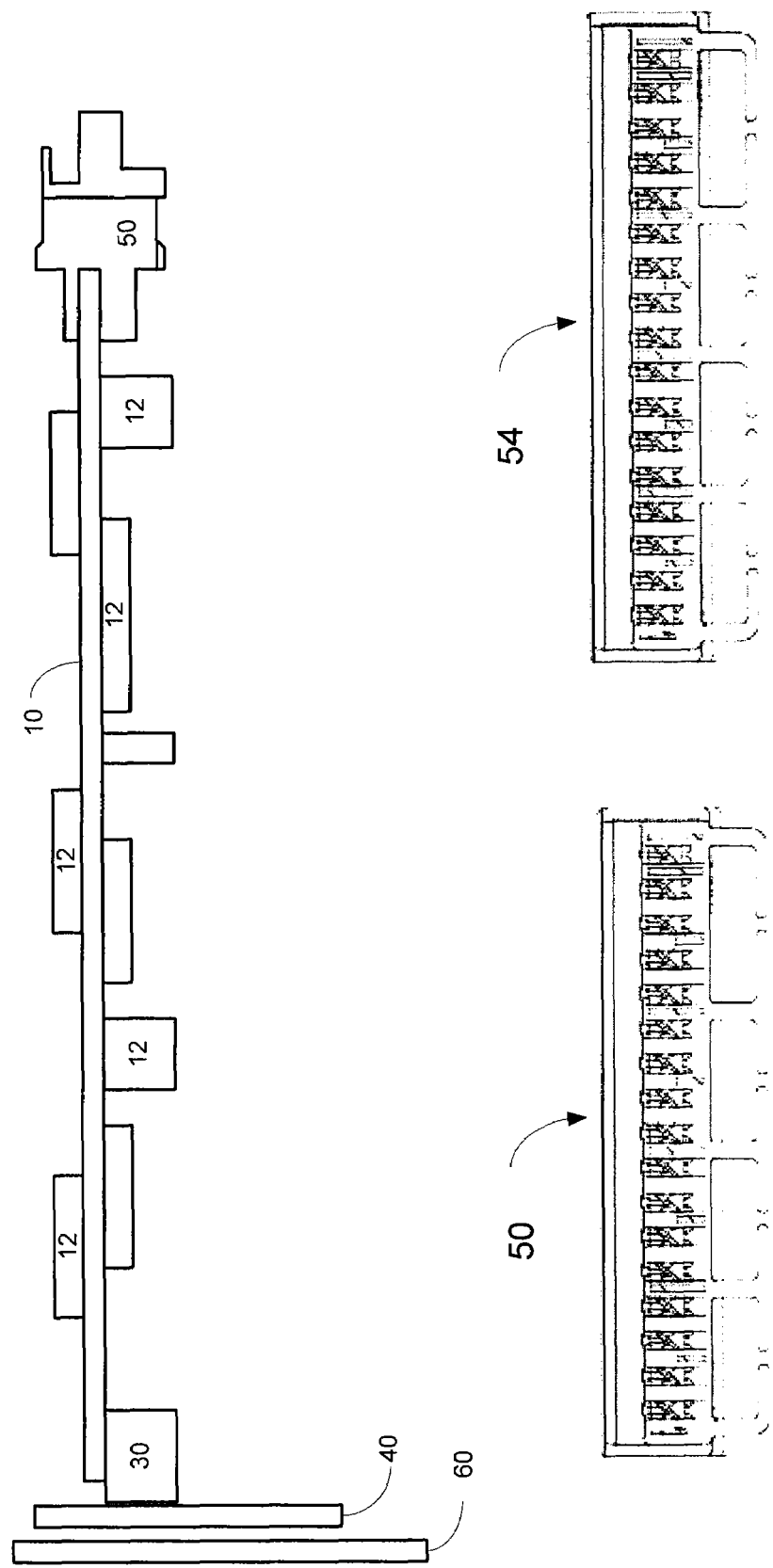
FIG. 2 is a cross section of a printed circuit board and of a slim edge connector, according to an embodiment of the invention.

FIG. 2 is a cross section of printed circuit board 10 and of slim edge connector 50, according to an embodiment of the invention.

The cross section is made along an imaginary horizontal line that is perpendicular to rear panel 14 of a communication cabinet.

Printed circuit board 10 and slim edge connector 10 are placed within a space defined by real panel 14 of communication cabinet 2 and by front panel (such as a pivotally mounted door) 16 of the communication cabinet.

At least one active communication components such as an amplifier, a processor and the like are connected to printed circuit board 10. Multiple components are illustrated by multiple boxes denoted 12.

Printed circuit board 10 is connected to backplane 40 by backplane connector 30. Backplane connector 30 can also provide structural support to printed circuit board 10. Backplane 40 and backplane connectors (such as backplane connector 30) connect between different printed circuit boards (such as printed circuit board 10).

Printed circuit board 10 is also connected to slim edge connector 50. Slim edge connector can be a slim edge connector such as LSA-PLUS edge connector of Krone of Berlin, Germany. A slim edge connector is characterized by a depth that is substantially small, and can be much smaller than the width of the slim edge connector. The slim edge connectors can be slim MDF connectors.

FIG. 2 also illustrates a front view of two slim edge connectors 50 and 54, each including sixteen insertion contact pairs, for connecting sixteen pairs of wires. One wire from input cable 5 and one wire towards a customer connector. These contacts can be holes in which the wires are inserted, but this is not necessarily so.

Figure 3:
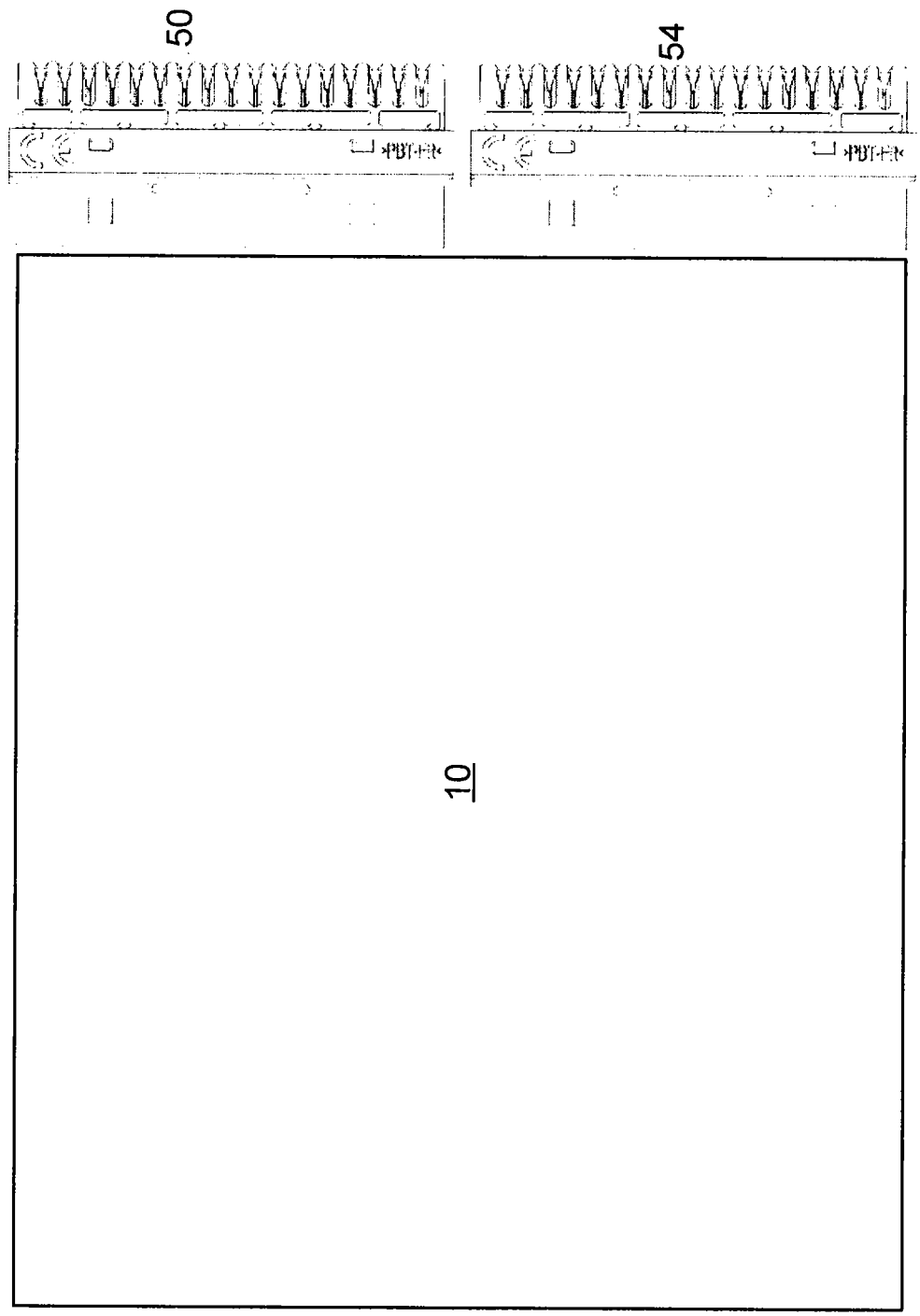
FIG. 3 is a side view of a printed circuit board and two slim edge connectors, according to an embodiment of the invention.

FIG. 3 is a side view of printed circuit board 10 and two slim edge connectors 50 and 54, according to an embodiment of the invention. This figure illustrates a printed circuit board 10 that has a width of 110 mm, a length of 155 mm, and it is connected to two slim edge connectors 50 and 54. It is noted that the printed circuit boards can have other dimensions. The inventors found that larger printed circuit boards can be installed within a communication cabinet if they are installed in a vertical manner.

Figure 4:
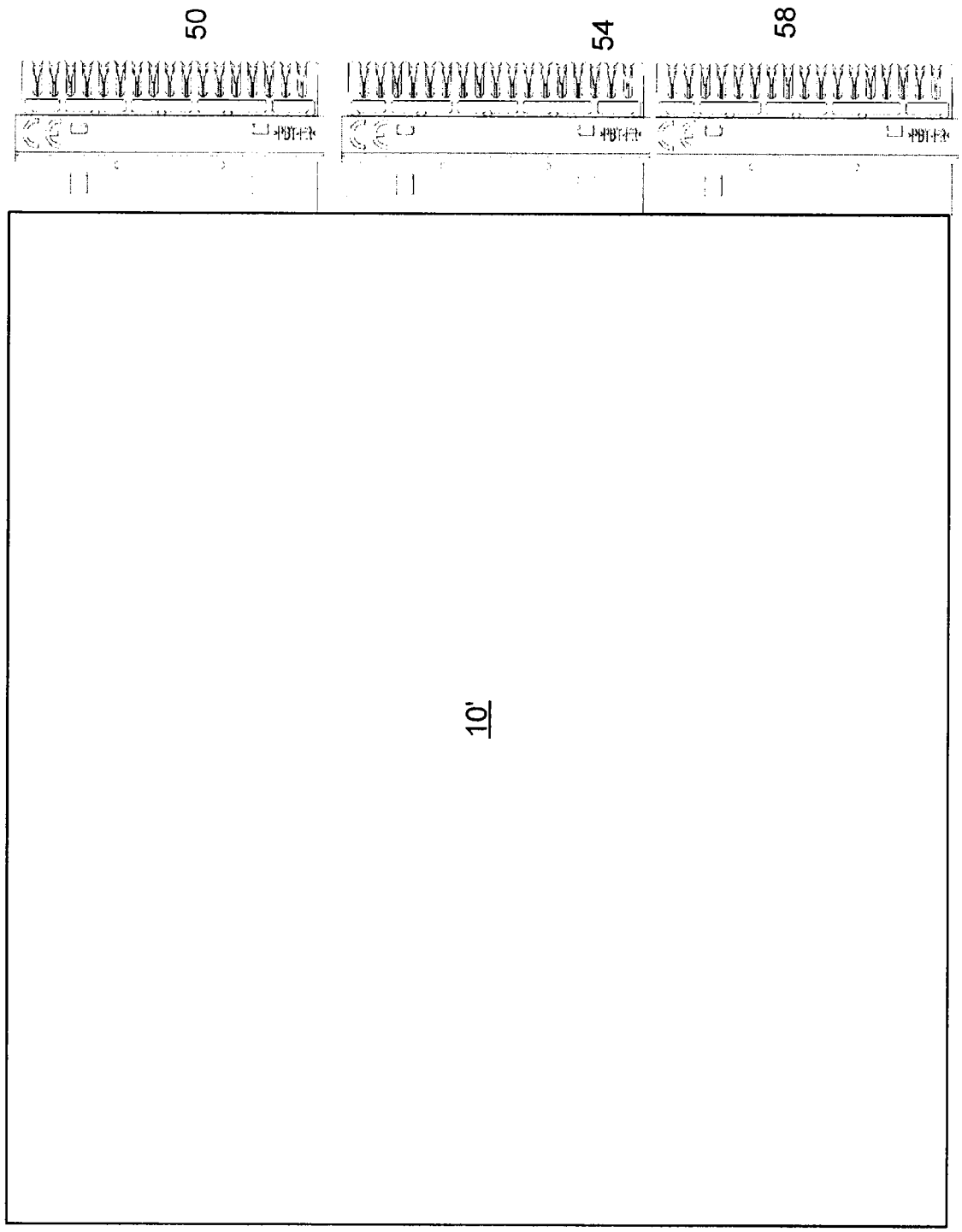
FIG. 4 is a side view of a printed circuit board and three slim edge connectors, according to an embodiment of the invention.

FIG. 4 is a side view of printed circuit board 10' and three slim edge connectors 50, 54 and 58, according to an embodiment of the invention. Printed circuit board 10 that has a width of 160 mm, a length of 155 mm, and it is connected to three slim edge connectors 50, 54 and 56.

Figure 5:
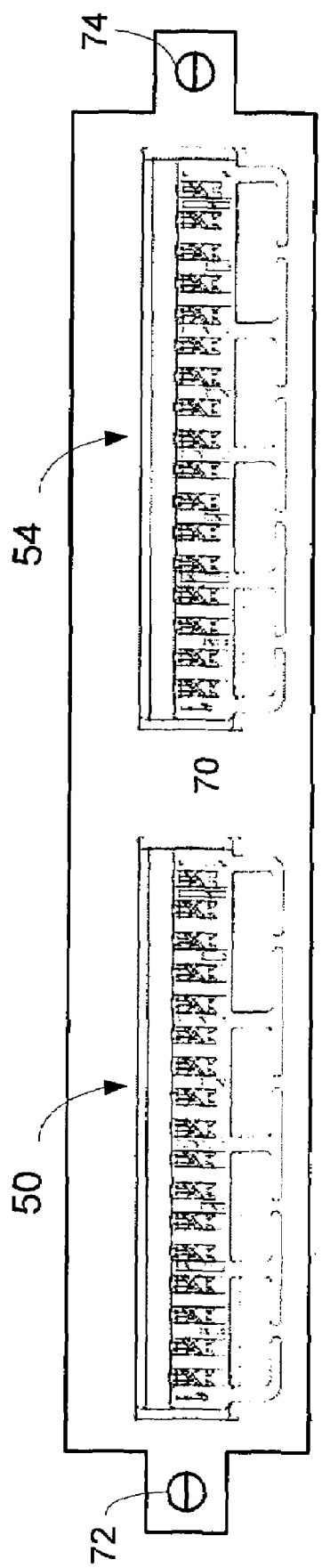
FIG. 5 is a front view of two slim edge connectors and a metal face plate, according to an embodiment of the invention.

FIG. 5 is a front view of two slim edge connectors 50 and 54 and metal face plate 70, according to an embodiment of the invention.

Metal face plate 70 is fastened to a printed circuit board (not shown) by a pair of screws 72 and 74 that hold slim edge connector 50 and 54 in place.

Figure 6:
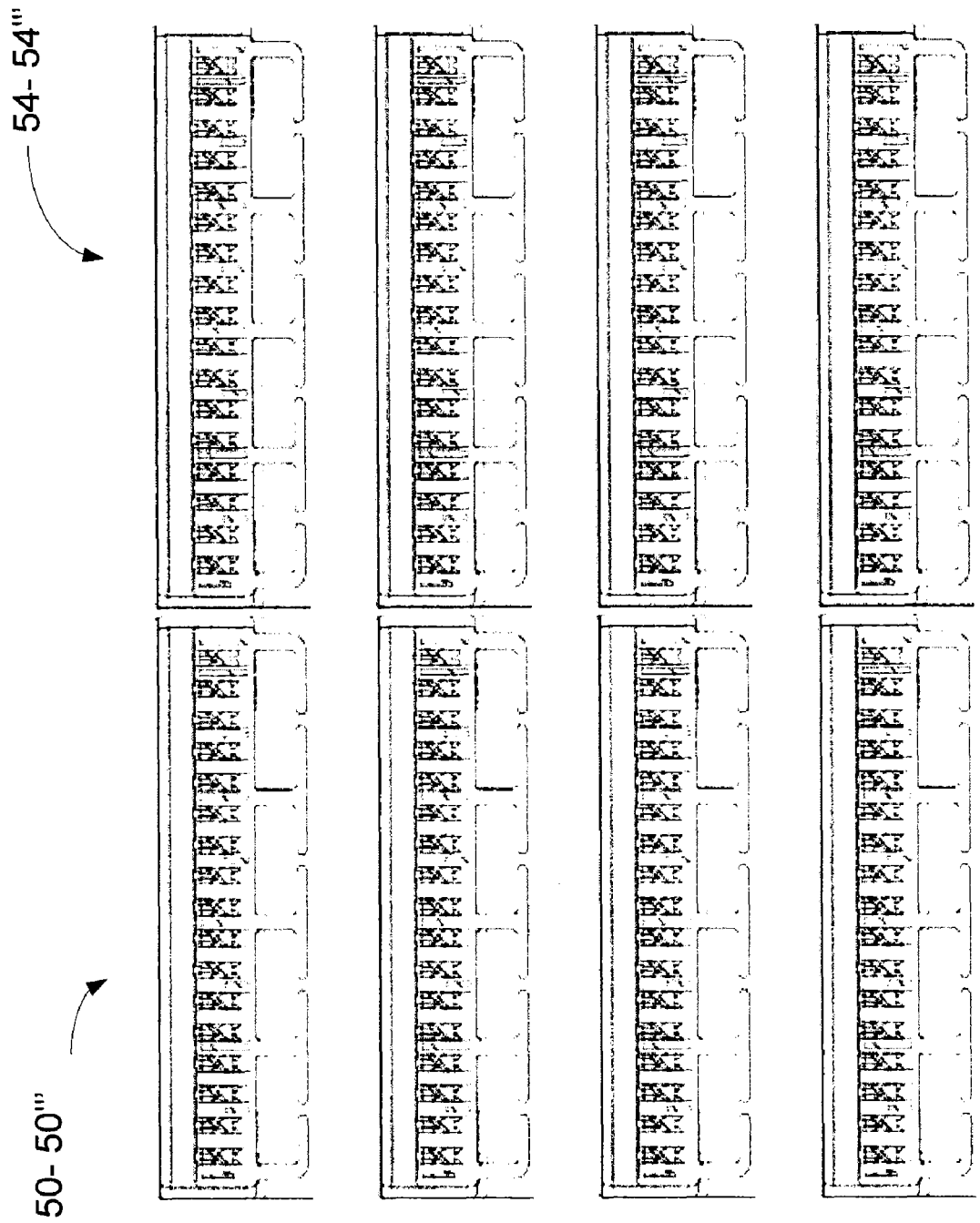
FIG. 6 is a front view of multiple slim edge connectors installed in a communication cabinet, according to an embodiment of the invention.

FIG. 6 is a front view of multiple slim edge connectors 50-50''' and 54-54''', that are installed in a communication cabinet, according to an embodiment of the invention.

FIG. 6 illustrates four pairs of horizontally oriented slim edge connectors that are connected to four horizontally installed printed circuit boards. The printed circuit boards are installed one over the other.

Accordingly, slim edge connectors 50 and 54 are connected to a first printed circuit board, slim edge connectors 50' and 54' are connected to a second printed circuit board, slim edge connectors 50'' and 54'' are connected to a third printed circuit board and slim edge connectors 50''' and 54''' are connected to a fourth printed circuit board.

Figure 7:
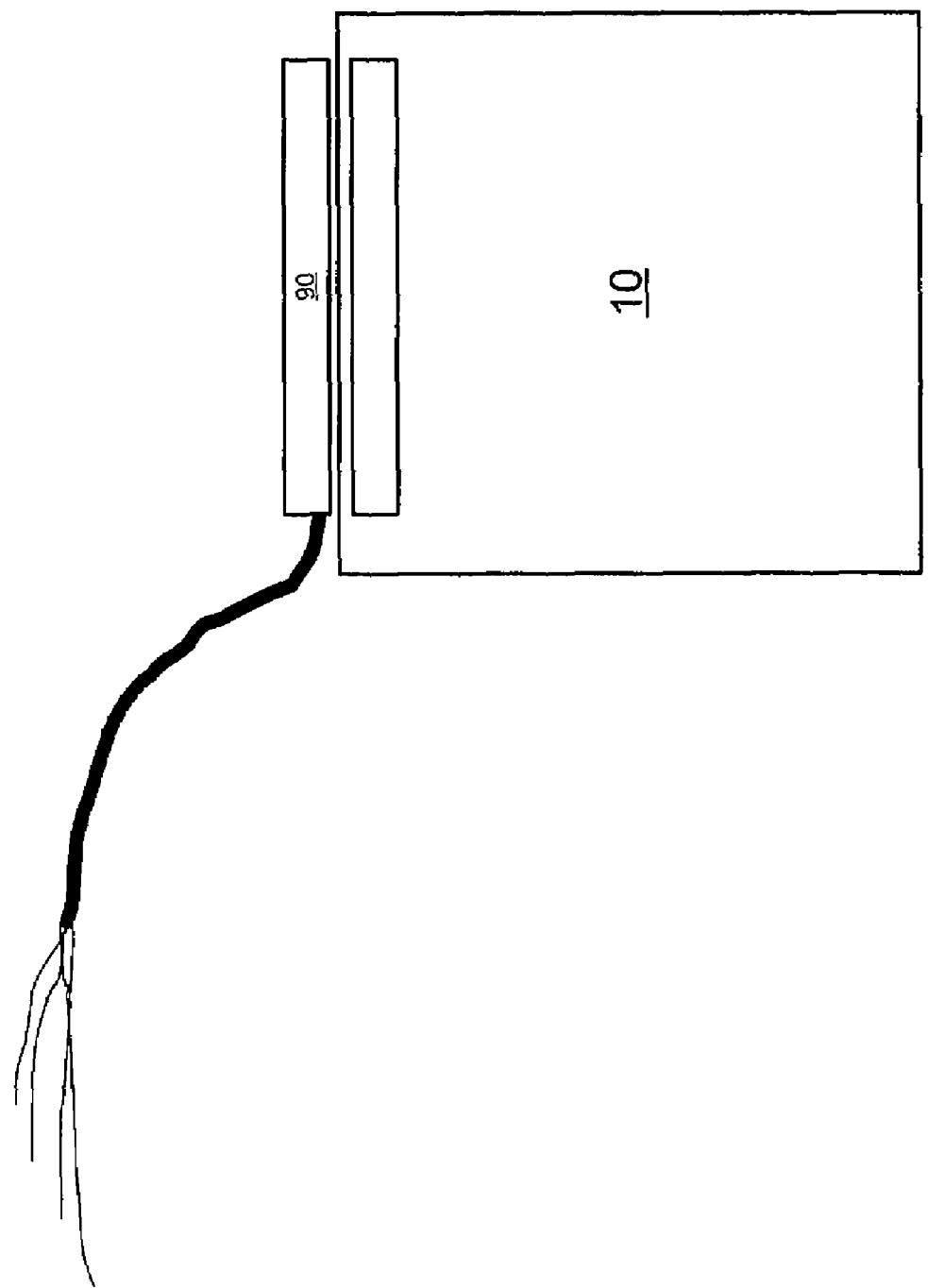
FIG. 7 illustrates a printed circuit board and a slim edge connector according to another embodiment of the invention.

FIG. 7 illustrates printed circuit board 10 and slim edge connector 90 according to another embodiment of the invention.

Slim edge connector 90 differs from slim edge connector 50 by including multiple wires that are connected to multiple pins in a fixed manner, and not by inserting them into connector cavities (as done when wires are connected to slim edge connector 50). This configuration is characterized by a higher wire density.

Figure 8:
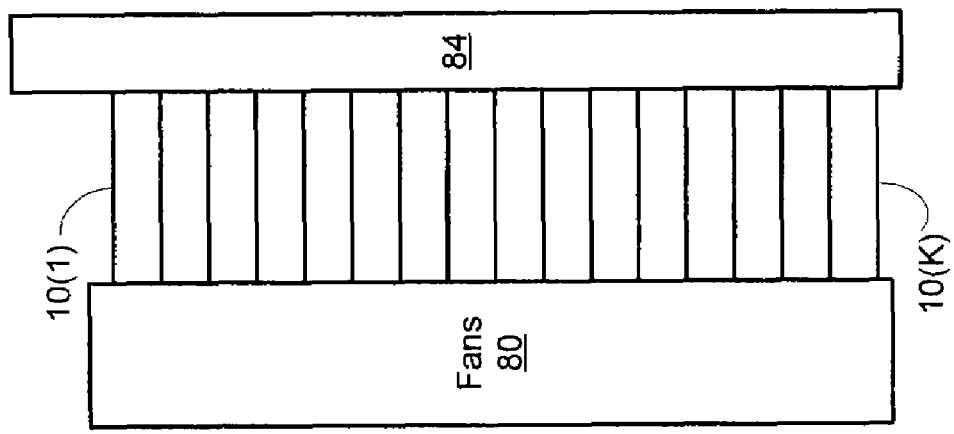
FIG. 8 is a schematic front view of an exemplary instillation configuration of multiple printed circuit boards, according to an embodiment of the invention.

FIG. 8 is a schematic front view of an exemplary instillation configuration of multiple printed circuit boards, according to an embodiment of the invention.

Multiple printed circuit cards 10(1)-10(K) form a column of horizontally oriented printed circuit cards. The printed circuit cards are positioned one above the other. Fans 80 are positioned on the left of the column while hot air deflector 84 is positioned to the right of the column. Fans 80 direct cold air towards the printed circuit boards, and the air flows from left to right, through horizontal spaces defined between the printed circuit boards towards hot air deflector that directs the hot air to exit the communication cabinet via one or more ventilation apertures (not shown).

Figure 9:
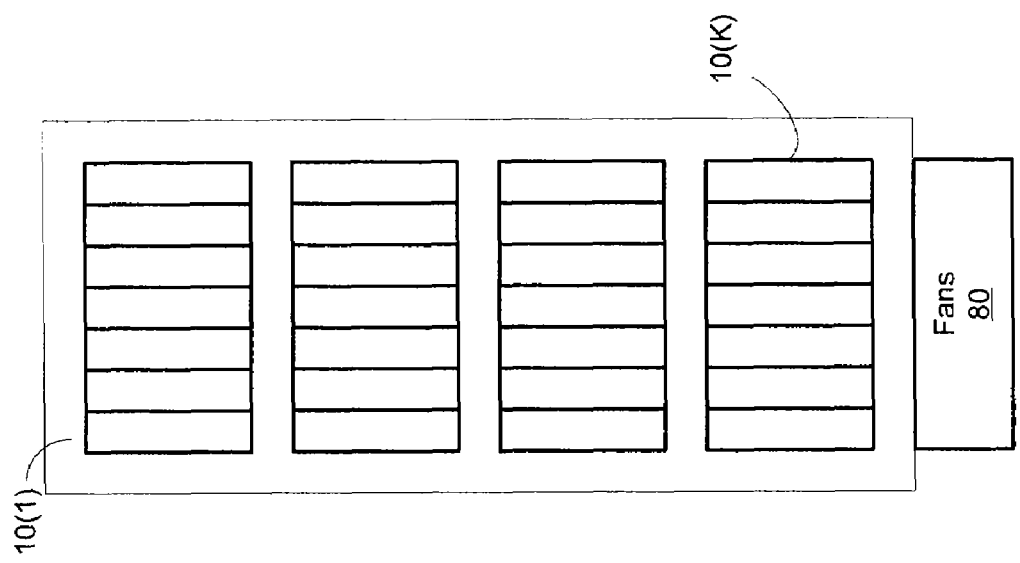
FIG. 9 is a schematic front view of an exemplary instillation configuration of multiple printed circuit boards, according to an embodiment of the invention.

FIG. 9 is a schematic front view of an exemplary instillation configuration of multiple printed circuit boards, according to an embodiment of the invention.

Multiple printed circuit boards 10(1)-10(K) are installed in a vertical manner. The vertical printed circuit boards can be arranged in multiple rows, as illustrated in FIG. 9, but this is not necessarily so.

Fans 80 are positioned below printed circuit boards 10(1)-10(K) and direct cold air towards the printed circuit boards. The air flows upwards, through vertical spaces defined between the printed circuit boards until exiting a communication cabinet via one or more ventilation apertures (not shown).

Figure 10:
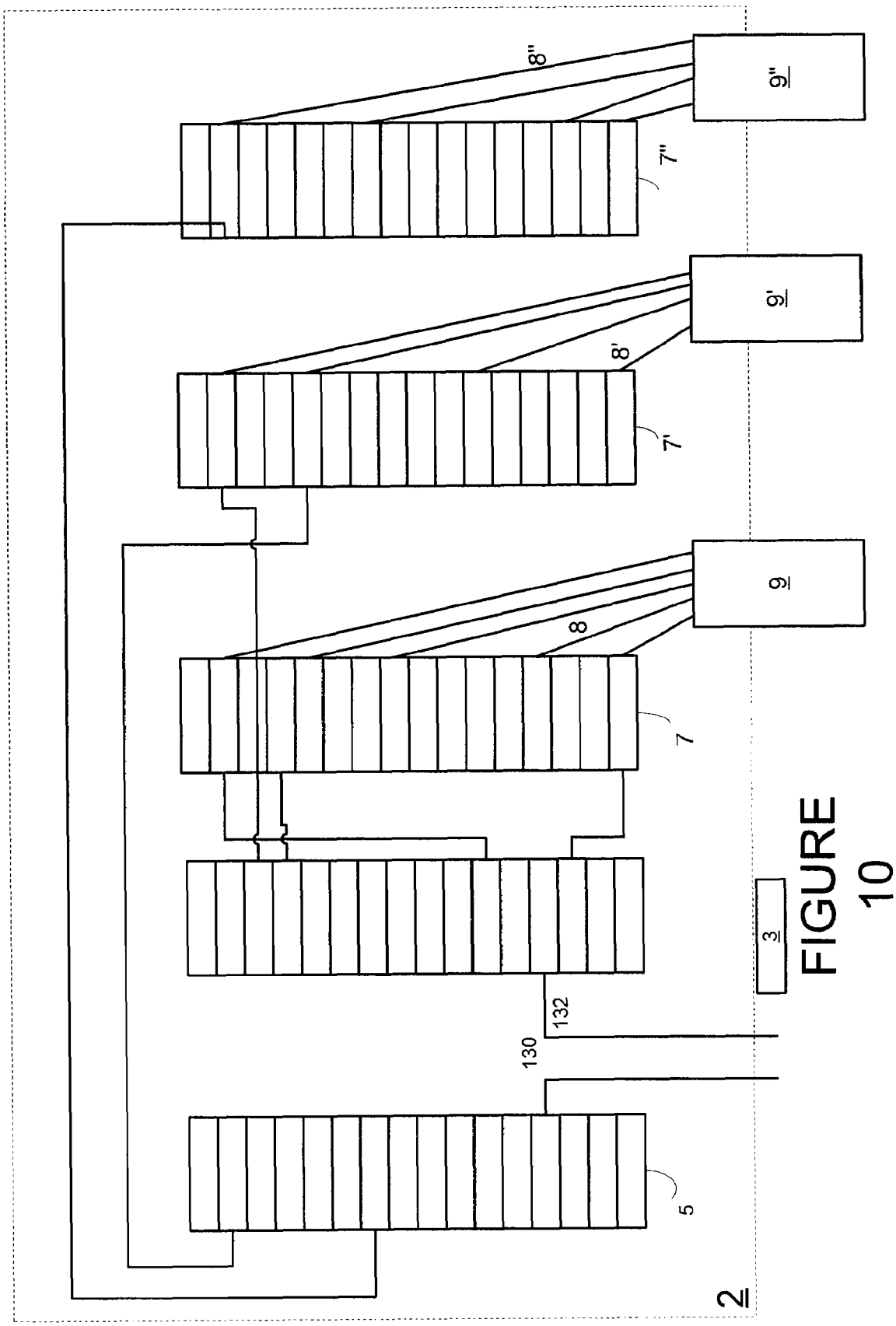
FIG. 10 illustrates an exemplary installation configuration according to an embodiment of the invention.

FIG. 10 illustrates an exemplary installation configuration according to an embodiment of the invention.

FIG. 10 illustrates communication cabinet 100 that includes two columns 110 and 112 of printed circuit boards and slim edge connectors, and three columns 120-124 of customer connectors.

Figure 1:
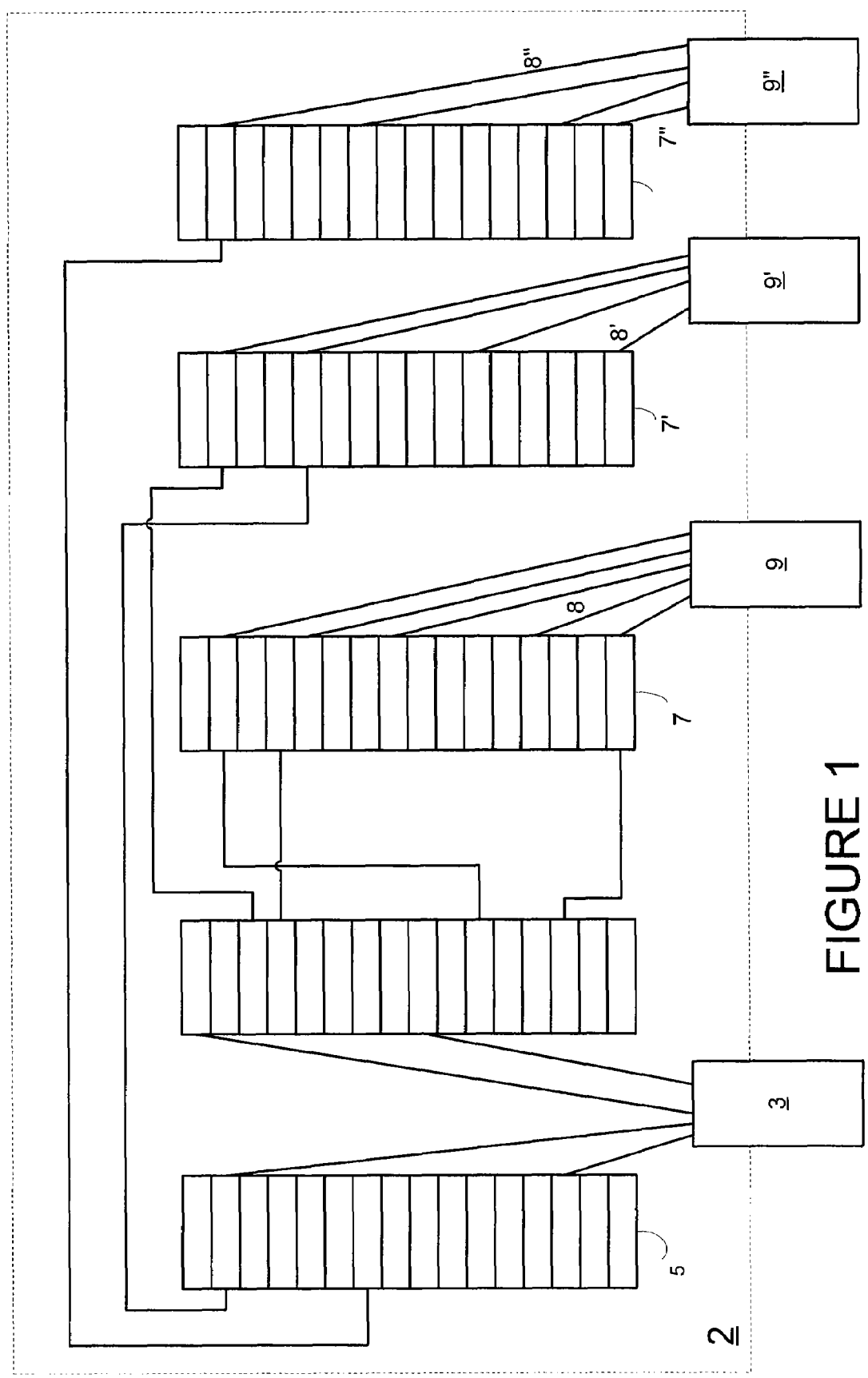
FIG. 1 illustrates a prior art communication cabinet.

Communication cabinet 100 receives a first input cable 3' and a pair of optical cables 130 and 132. Optical cables 130 and 130 are connected to backplane 40 (not show) via optical connectors. These optical cables convey information instead of input cable 3 of FIG. 1. Accordingly, multiple wires of input cable 3' can be used for conveying power, as they are used to convey information.

Multiple wires (collectively denoted 6) connect between slim edge connectors and connectors of second set of connectors 7. Multiple customer connectors of second set of connectors 6 are also connected to output cables such as output cables 9, 9' and 9". Each output cable (out of output cables 9, 9' and 9") includes multiple wires that connect multiple customer connectors to multiple customer premises equipment. Conveniently, second set of connectors 7 includes a large number of horizontally installed customer connectors that are arranged in three columns, one column per output cable.

It is noted that remote power feeding by wires of input cable can be used when the printed circuit boards are vertically installed.

It is further notes that at least one of the printed circuit board can act as a power supply card that can apply various filtering and power conversion operations on the received power. It is further noted that communication cabinet 100 can also include batteries.

Figure 11:
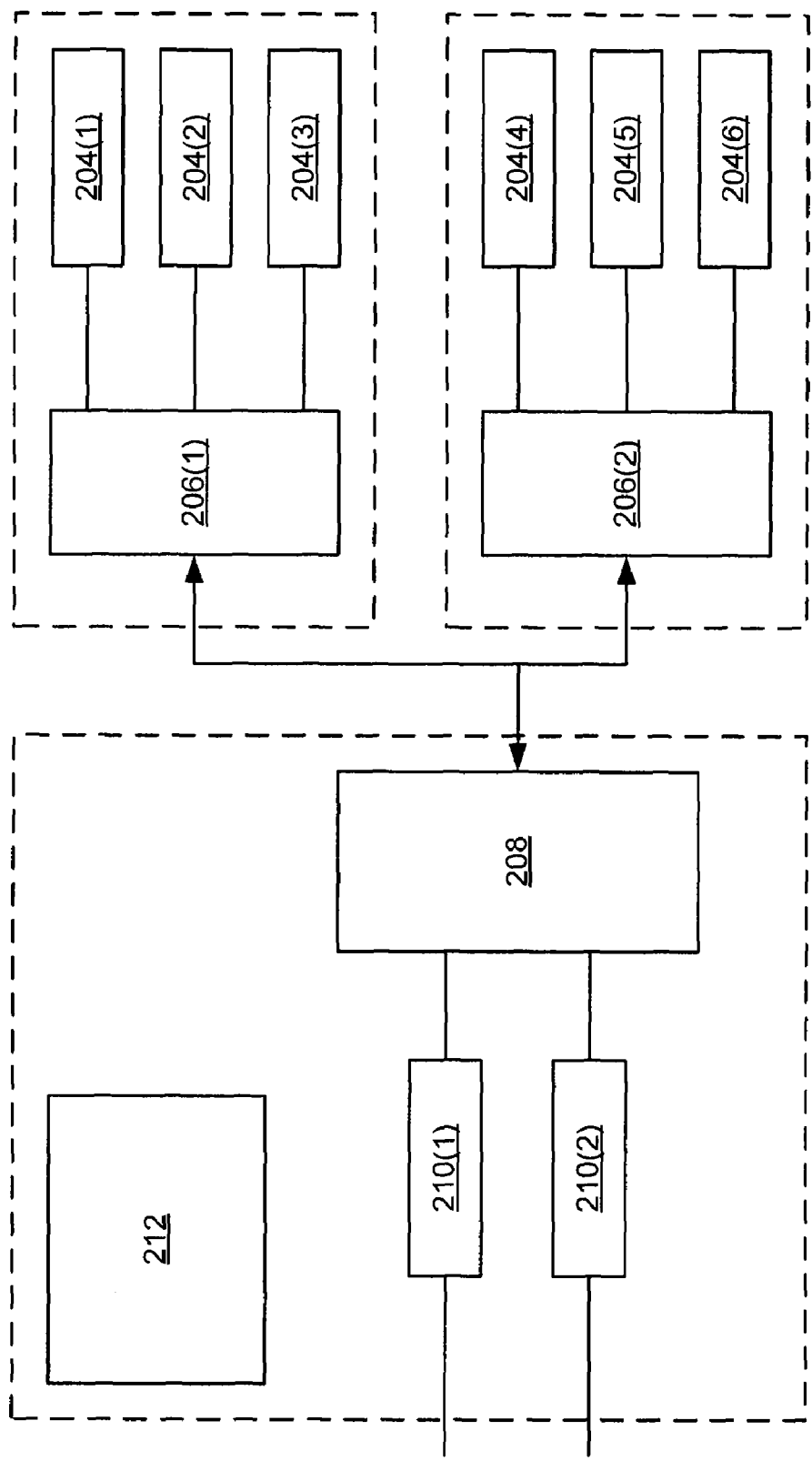
FIG. 11 illustrates multiple printed circuit boards that originate from a single printed circuit board, according to an embodiment of the invention.

FIG. 11 illustrates multiple printed circuit boards 10(1)-10(3) that replace printed circuit board 11, according to an embodiment of the invention.

Printed circuit board 11 is too big for being installed within communication cabinet 100 in the manner that either one of printed circuit boards 10(1)-10(3) are installed.

Accordingly, printed circuit board 11 is replaced by three compact printed circuit boards 10(1)-10(3) that are installed in communication cabinet 100, and will be connected to each other by backplane 40. Each printed circuit board out of 10(1)-10(3) can be connected to customer connectors via slim edge connectors and wires.

Printed circuit board 11 is an ADSL line card. It can interface with forty eight lines (forty eight pairs of wires connected to forty eight customer premises equipment) that are clustered in six clusters of eight lines each. Each cluster out of clusters 202(1)-202(6) is connected to an edge integrated circuit out of edge integrated circuits 204(1)-204(6). Each edge integrated circuit functions as an analog front end (AFD) and as line driver (LD).

Edge integrated circuits 204(1)-204(3) are connected to intermediate integrated chip (denoted G24) 206(1) that further processes digital signals that are sent to and from edge integrated circuits 204(1)-204(3). Edge integrated circuits 204(4)-204(6) are connected to intermediate integrated chip (denoted G24) 206(2) that further processes digital signals that are sent to and from edge integrated circuits 204(4)-204(6).

Intermediate integrated circuits 206(1) and 206(2) are connected to a central integrated circuit 208 that implements the high speed, bidirectional ATM interface knows as UTOPIA. Central integrated circuit 208 also performs higher-level functions such as conversion to Ethernet, switching and more. Central integrated circuit 208 is connected via two Ethernet adaptors 210(1) and 210(2) to two Ethernet lines.

Printed circuit board 11 is also connected to power supply integrated circuit 212 that converts an input power of −48VDC into the internal voltages needed by the various integrated circuits mentioned below.

Overall, printed circuit board 11 converts Ethernet information that is provided by a central office to 48 ADSL streams that feed the 48 telephone lines connected to communication cabinet 100 via output cables. Printed circuit board 11 also converts the 48 ADSL streams into one or two Ethernet streams that are sent to the central office.

As indicated above (as indicated by dashed boxes 10(1)-10(3)) printed circuit board 11 was replaced by three printed circuit boards 10(1)-10(3). Edge integrated circuits 201(1)-204(3) and intermediate integrated circuit 206(1) are connected to printed circuit board 10(1). Edge integrated circuits 201(4)-204(6) and intermediate integrated circuit 206(2) are connected to printed circuit board 10(2). Printed circuit board 10(3) supports central integrated circuit 208 and power supply integrated circuit 212.

Figure 12:
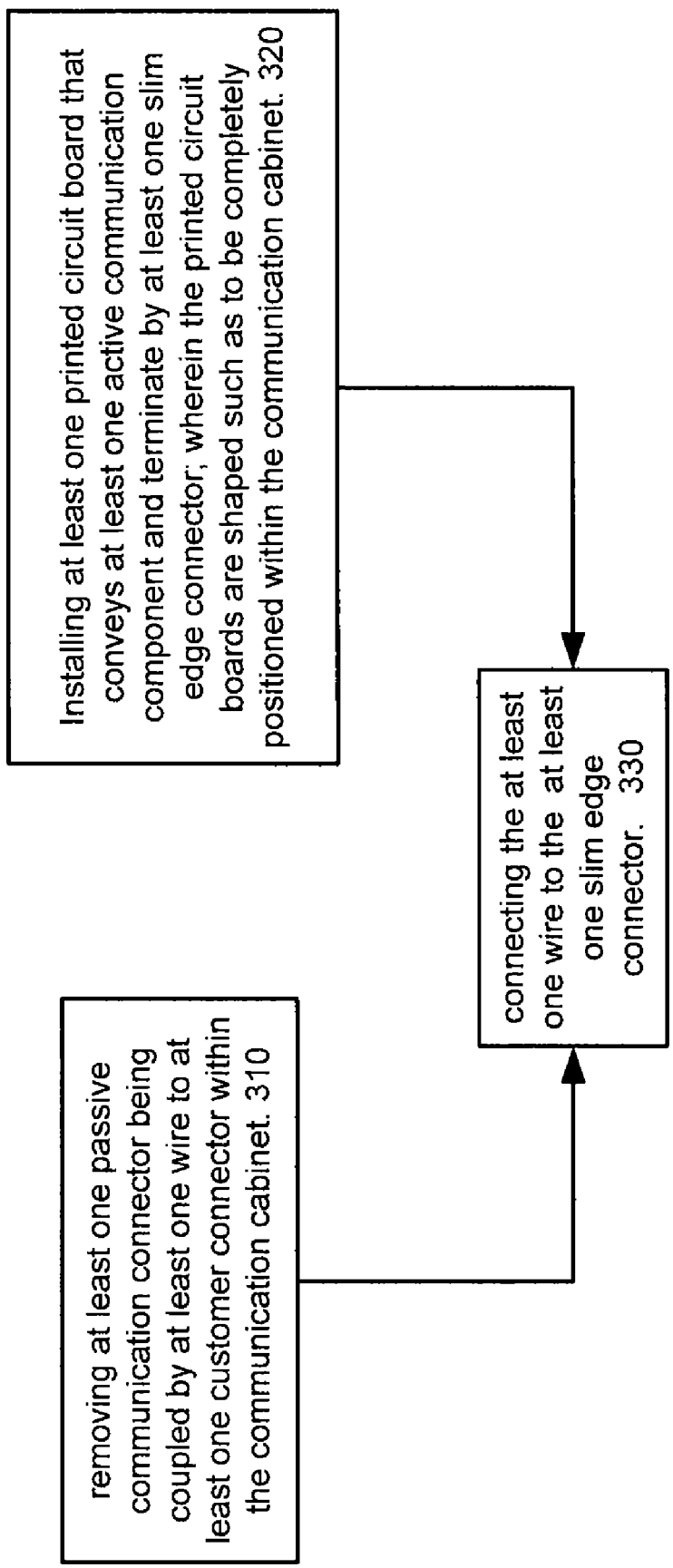
FIG. 12 is a flow chart of a method for installing a modular communication cabinet, according to an embodiment of the invention.

FIG. 12 is a flow chart of method 300 for installing a modular communication cabinet, according to an embodiment of the invention.

Conveniently, the depth of the communication cabinet does not exceed 30 centimeters. This is not necessarily so.

Method 300 starts by stages 310 and 320. Stage 310 includes removing at least one passive communication connector being connected by at least one wire to at least one customer connector within the communication cabinet.

Stage 320 of installing at least one printed circuit board that are connected to at least one active communication component and is also connected to by at least one slim edge connector. The printed circuit boards are shaped such as to be completely positioned within the communication cabinet. Referring to the example set fourth in FIG. 2, the communication cabinet can include one or more backplanes, multiple printed circuit boards and multiple slim edge connector. These units are fully positioned within an internal space defined by the communication circuit.

Conveniently, stage 320 of installing includes installing multiple printed circuit boards that are coupled to each other via a backplane positioned at a rear side of the multiple printed circuit boards. FIG. 2 illustrates an exemplary configuration of a printed circuit board that is positioned between a slim edge connector and between a backplane.

Conveniently, stage 320 of installing includes installing multiple printed circuit boards in a vertical manner. FIG. 9 provides an example of vertically installed printed circuit boards.

Conveniently, stage 320 of installing includes installing fans such as to direct air towards the vertical positioned printed circuit boards. FIG. 9 provides an example of vertically installed printed circuit boards and fans that direct air to flow upwards, especially through vertical spaced defined by the vertically installed printed circuit boards.

Conveniently, stage 320 of installing includes installing multiple printed circuit boards that are coupled to each other via a backplane positioned at the rear side of the multiple printed circuit boards. FIG. 2 illustrates an exemplary configuration of a printed circuit board that is positioned between a slim edge connector and between a backplane.

Conveniently, stage 320 of installing includes feeding the at least one printed circuit board by power remotely conveyed to the communication cabinet from a central office. FIG. 10 illustrates a communication cabinet that received power via some wires out of multiple wires that are included in a cable that connected a communication cabinet to a central office.

Stages 310 and 330 are followed by stage 330 of connecting the at least one wire to the at least one slim edge connector.

Conveniently, stage 330 of connecting includes connecting at least one wire without substantially interrupting an operability of the communication cabinet. This can be achieved by reconnecting one wire after the other while maintaining the connections between the replaced connectors and between the customer connectors and input cable until these wires are reconnected to a slim edge connector.

Conveniently, stage 330 of connecting includes connecting multiple wires, one wire after the other, to a slim edge connector by inserting different wires to different connector contacts (such as but not limited to cavities) within the slim edge connector. The insertion can be applied in slim edge connectors such as slim edge connectors 50, 54 of FIGS. 2-6.

Conveniently, stage 330 of connecting includes connecting multiple wires that extend from a slim edge connector, to multiple customer equipment. Referring to the example set fourth in FIG. 7, wires that extend from slim edge connector 90 are connected to multiple customer equipment.

It is noted that when multiple passive connectors are replaced by multiple printed circuit boards then each printed circuit board can be installed after the corresponding passive connector is removed. Thus, an installation process may include multiple repetitions of removing one or more passive connector, installing one or more printed circuit board instead of the one or more removed passive connectors and connecting the wires that were previously connected to the one or more passive connectors. It is noted that even disconnected passive connectors can still function, at least until the wires that connect them to the customer equipment an/or cable that arrives from a central office are disconnected.

FIG. 13 is a flow chart of method 400 for installing a modular communication cabinet, according to an embodiment of the invention.

Method 400 starts by stage 410 of installing at least one printed circuit board that is connected to at least one active communication component and to at least one slim edge connector. The printed circuit boards are shaped such as to be completely positioned within the communication cabinet. The depth of the communication cabinet does not exceed 30 centimeter.

Conveniently, stage 410 includes at least one of the following or a combination thereof: (i) Installing multiple printed circuit boards that are connected to each other via a backplane positioned at a rear side of the multiple printed circuit boards; (ii) Installing multiple printed circuit boards in a vertical manner; (iii) Installing fans such as to direct air towards vertical positioned printed circuit boards; (iv) Installing multiple printed circuit boards that are connected to each other via a backplane positioned at a rear side of the multiple printed circuit boards. (v) Feeding the at least one printed circuit board by power supplied to the communication cabinet from a remote central office.

Stage 410 is followed by stage 420 of connecting at least one wire between the at least one slim edge connector and between one customer connector within the communication cabinet.

Conveniently, stage 420 includes one of the following: (i) Connecting multiple wires, one wire after the other, to a slim edge connector by inserting different wires to different connector contacts (such as but not limited to cavities) within the slim edge connector; or (ii) connecting multiple wires that extend from a slim edge connector, to multiple customer connectors positioned within the communication cabinet.

Those of skill in Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

I claim:

1. In a communication cabinet having at least one passive connector connected by at least one wire to at least one customer connector within the communication cabinet
   a method for installing an active component into the communication cabinet in-situ, the method comprising:
   removing the at least one passive communication connector coupled by at least one wire to at least one customer connector within the communication cabinet;
   replacing the at least one removed passive communication connector with an edge connector; installing into the communication cabinet at least one printed circuit board, that is coupled to at least one active communication component; wherein the printed circuit boards are sized and shaped such as to be completely positioned within the communication cabinet;
   coupling the at least one active communication component to the edge connector;
   and connecting the at least one wire to the edge connector.

2. The method according to claim 1 wherein the connecting comprises connecting at least one wire without substantially interrupting a service provided to customers coupled to the communication cabinet.

3. The method according to claim 1 wherein the installing comprises installing multiple printed circuit boards that are coupled to each other via a backplane positioned at a rear side of the multiple printed circuit boards.

4. The method according to claim 1 wherein the installing comprises installing multiple printed circuit boards in a vertical manner.

5. The method according to claim 4 wherein the installing comprises installing fans such as to direct air towards the vertical positioned printed circuit boards.

6. The method according to claim 4 wherein the installing comprises installing multiple printed circuit boards that are coupled to each other via a backplane positioned at the rear side of the multiple printed circuit boards.

7. The method according to claim 1 wherein the installing comprises feeding the at least one printed circuit board by power supplied to the communication cabinet from a remote central office.

8. The method according to claim 1 wherein the connecting comprises connecting multiple wires, one wire after the other, to a slim edge connector by inserting different wires to different connector contacts of the slim edge connector.

9. The method according to claim 1 wherein connecting comprises connecting multiple wires that extend from a slim edge connector, to multiple customer connectors positioned within the communication cabinet.

10. The method according to claim 1 wherein the installing comprises installing within a communication cabinet that has a depth that does not exceed 30 centimeters.

11. The method according to claim 1 wherein the installing comprises installing within a communication cabinet that has a depth that does not exceed 20 centimeters.

\* \* \* \* \*